United States Patent [19]
Dutta et al.

[11] Patent Number: 5,917,194
[45] Date of Patent: Jun. 29, 1999

[54] MESOSCOPIC ELECTRONIC DEVICES WITH TAILORED ENERGY LOSS SCATTERING

[75] Inventors: Mitra Dutta, Silver Spring, Md.; Michael A. Stroscio, Durham, N.C.; Gerald J. Iafrate, Raleigh, N.C.; Ki Wook Kim, Durham, N.C.; Yuri M. Sirenko, Raleigh, N.C.

[73] Assignee: The United States of America as represented by the Secretary of the Army, Washington, D.C.

[21] Appl. No.: 08/684,766

[22] Filed: Jul. 17, 1996

[51] Int. Cl.$^6$ ............... H01L 31/0352; H01L 29/775
[52] U.S. Cl. ............... 257/17; 257/14; 257/20; 257/24
[58] Field of Search ............... 257/14, 17, 20, 257/24

[56] References Cited

U.S. PATENT DOCUMENTS

| H1570 | 8/1996 | Lux et al. | 257/20 |
| 5,453,627 | 9/1995 | Aihara et al. | 257/24 |

FOREIGN PATENT DOCUMENTS

| 5-95105 | 4/1993 | Japan | 257/17 |
| 5-315597 | 11/1993 | Japan | 257/24 |

OTHER PUBLICATIONS

Stroscio et al, "Phonon Modes in Quantum Wires and Quantum Dots", Journal of Applied Physics, vol. 76, p. 4670 (1994).

Bannov et al, "Confined Acoustic Phonons in a Free–Standing Quantum Well," Proceedings of the 1993 International Semiconductor Device Research Symposium, p. 659, 1993.

Shi et al, "Optimal Control of Selectivity of Unimolecular Reactions via an Excited Electronic State with Designed Lasers", Journal of Chemical Physics, 97, pp. 276–287.

Leobandung et al, "Observation of Quantum Effects and Coulomb Blockage in Silicon Quantum Dot Transistors at Temperatures Over 100 Kelvin", Journal of Applied Physics,.

Stroscio et al, "Piezoelectric Scattering of Carriers in Confined Acoustic Modes in Cylindrical Quantum Wires", Physical Review B, vol. 48, pp. 1936–1939, Jul. 1993.

Macucci et al, "Simulations of Electronic Properties And Capacitance of Quantum Dots", Journal of Applied Physics, vol. 77, pp. 3267–3276.

*Primary Examiner*—Jerome Jackson, Jr.
*Attorney, Agent, or Firm*—Michael Zelenka; John M. O'Meara

[57] ABSTRACT

A mesoscopic structure is fabricated such that the desired dominant modes of the acoustic phonons in the structure have wavelengths such that the length of a half-integral number of wavelengths equals the length of the structure through which the desired electron wave is propagating. A manner of achieving this object is to provide for a material in a quantum wire and a material at the end of the quantum wire such that the two materials have such different properties (as disclosed hereinafter) to abruptly dampen the phonon modes at the interface between the two materials. With such an interface, a clamped boundary condition will occur and the modes of amplitude can be assumed to vanish at the interface. Such a case applies at some metal-semiconductor interfaces. In particular, for a mesoscopic device having wire-like regions which terminate on a variety of metal regions (regions used as contacts, gates, barriers, etc.), it is satisfactory to apply clamped boundary conditions. At these boundaries, the acoustic modes will have nodes instead of the anti-nodes that are established in the case of an open boundary.

13 Claims, 2 Drawing Sheets

MESOSCOPIC ELECTRONIC DEVICES WITH TAILORED ENERGY LOSS SCATTERING

GOVERNMENT INTEREST

The invention described herein may be manufactured, used, sold, imported, and/or licensed by or for the Government of the United States of America without the payment to us of any royalties thereon.

FIELD OF INTEREST

This invention relates to the field of electronic and optoelectronic devices used in signal and information processing and more particularly to current flow controller elements in mesoscopic scale signal processing devices.

BACKGROUND OF THE INVENTION

In recent publications, such as, "Quantized Acoustic Phonon Modes in Quantum Wires and Quantum Dots," Stroscio et al, *Journal of Applied Physics*, Vol. 76, pg. 4670 (1994), acoustic phonons have been quantized for a variety of nanoscale and mesoscopic structures in order to assess the role of electron/acoustic-phonon scattering in limiting the performance of nanoscale and mesoscopic electronic devices. These structures/devices include quantum wells, quantum wires with cylindrical and rectangular cross-sections, and quantum dots with spherical, cylindrical, and rectangular boundaries. These quantized phonons have been studied for two cardinal boundary conditions of classical acoustics: free boundaries (open boundaries) where the phonon displacements are unrestricted and allowed to balance all normal traction forces to zero; and clamped boundaries (rigid boundaries) where phonon displacements are required to vanish at the boundaries. For quantum wells, scattering rates have been calculated for free-standing structures. See for example, "Confined Acoustic Phonons in a Free-Standing Quantum Well," Bannov et al, *Proceedings of the* 1993 *International Semiconductor Device Research Symposium*, pg. 659. For the case of quantum wires, scattering rates have been calculated only for the case of infinitely long quantum wires and only in the lateral dimensions. However, for realistic mesoscopic devices designs, the quantum wire input and output "leads" as well as the active regions of the devices with quantum wire geometries obviously have finite lengths. Accordingly, deformation and piezoelectric scattering rates must be based on acoustic phonons that are quantized in all three spatial dimensions. However, heretofore, those skilled in the art have not considered the role of three dimensional confinement of acoustic phonons in mesoscopic devices.

Accordingly, it is a great challenge in the application of quantum based devices to consider the molecular feature-size implicit in nanoelectronic and mesoscopic technology. Many of these challenges concern fluctuations, tolerances, robustness, and other statistical considerations which conceivably negate many of the seemingly fragile characteristics of nanodevices. There are many illustrative examples in which inherent statistical variations in composition and device dimensions produce substantial deviation from the desired nanostructure electrical response. These examples include: minimum metal-oxide-semiconductor transistor size as determined by a combination of gate oxide breakdown, drain-source punch-through and substrate doping fluctuations; minimum planar bipolar transistor size as determined by a combination of collector junction breakdown, base punch-through and base doping fluctuations; effects of structural and alloy disordering on, the electronic states in quantum wires; and the effect of fabrication-related dimensional variations on carrier scattering rates in quantum wires.

Some prior proposed ways to overcome these problems and to achieve a more robust device include the application of Coulomb blockade effects, design through quantum control theory, and emulation of biological and chemical systems, such as neuron networking and self-organization finesse disordering processes. For example, potential applications of quantum control theory to "small" and mesoscopic electronic devices are motivated based on past uses of robust optimal control theory for the selective excitation of quantum mechanical vibrational states of molecules. See for example, Shi et al, "Optimal Control of Selectivity of Unimolecular Reactions via an Excited Electronic State with Designed Lasers," *Journal of Chemical Physics*, 97, pgs. 276–287. Additionally, a number of important, recent developments have included: the observation of Coulomb blockade effects at temperatures which are an appreciable fraction of room temperature; theoretical prescriptions for enhancing the reliability of single electron switches operating on the basis of Coulomb effects; and recent progress in understanding how mesoscopic Coulomb blockade effects may be used to greatly suppress noise in electron emission processes in p-i-n semiconductor junctions as well as in p-n microjunctions. The observation of Coulomb blockage effects at 100 degrees Kelvin has been extended recently by the principal authors of Leobandung et al, "Observation of Quantum Effects and Coulomb Blockage in Silicon Quantum Dot Transistors at Temperatures Over 100 Kelvin," *Journal of Applied Physics*, to 110 Kelvin for the case of holes and 170 Kelvin for electrons.

Heretofore, mesoscopic electronic devices functioning on the basis of de Broglie wave inference phenomena have been defined by the international community to realize high functionality with effectively very high data rate processing capabilities. These mesoscopic devices designs, however, are generally based on the assumption that deformation potential and piezoelectric scattering processes can be neglected and that other inelastic scattering mechanisms are absent. This assumption of negligible deformation potential and piezoelectric scattering rates is usually made for convenience of the device designer and it has not been demonstrated that mesoscopic electronic devices can be realized with the needed levels of de Broglie wave coherence when deformation potentials and piezoelectric scattering are accounted for properly.

As a result, no one heretofore has been able to tailor the deformation potential and piezoelectric scattering in mesoscopic devices in order to maintain de Broglie wave coherence. The present invention fulfills this need.

SUMMARY OF THE INVENTION

Accordingly, one object of the present invention is to provide a mesoscopic device structure which tailors the deformation potential and piezoelectric scattering rates so that the piezoelectric scattering is reduced and a desired de Broglie wave coherence is enhanced.

Another object of the present invention is to provide such a mesoscopic structure which is more robust and less fragile than any other mesoscopic device structure heretofore disclosed.

These and other objects of the present invention are accomplished, for example, by fabricating a mesoscopic structure such that the desired dominant modes of the acoustic phonons in the structure have wavelengths such that the length of a half-integral number of wavelengths equals the length of the structure through which the desired signal is propagating. A manner of achieving this object is to provide for a material in a quantum wire and a material at the end of the quantum wire such that the two materials have such different properties (as disclosed hereinafter) to abruptly dampen the phonon modes at the interface between the two materials. With such an interface, a clamped boundary condition will occur and the modes of amplitude can be assumed to vanish at the interface. Such a case applies at some metal-semiconductor interfaces. In particular, for a mesoscopic device having wire-like regions which terminate on a variety of metal regions (regions used as contacts, gates, barriers, etc.), it is satisfactory to apply clamped boundary conditions. At these boundaries, the acoustic modes will have nodes instead of the anti-nodes that are established in the case of an open boundary.

In one example of the general method of the present invention for determining the longitudinal components of acoustic phonon modes in wire-like nanostructures, the prescription formulated is assumed to be for a cylindrical quantum wire of finite length. The quantized acoustic phonon mode displacements for this structure are found in Stroscio et al, "Piezoelectric Scattering of Carriers in Confined Acoustic Modes in Cylindrical Quantum Wires," *Physical Review B*, Vol. 48, pgs. 1936–1939 (July 1993) for the case where the ends of cylindrical wire at z=0 and z=L, are treated as free boundaries. For this example, therefore, the displacement is:

$$u(r, z) = \sqrt{(h/4\pi M \omega)} \times (2r/a) \times c\cos(m\pi z/L)$$

where a is the wire radius, M is the mass of the ions in a unit cell, h is Planck's constant, ω is the phonon angular frequency, m is the mode number, and r and z are the radial and axial coordinates of the quantum wire, respectively. According to the present invention, the mode displacements for the case where the ends of the wire are clamped are given by replacing cos(mπz/L) with sin(mπz/L). This application of the present invention illustrates the general features of the axial components of the acoustic phonon modes in quantum wires subjected to free-standing or clamped boundary conditions at the ends of the wire.

With this set of simplified boundary conditions it would be evident to one skilled in the art to design mesoscopic structures with the phonons "engineered" to produce desired standing wave patterns. Indeed, by selecting various wire lengths it is possible to define a standing wave pattern that either maximizes or minimizes the amplitudes of specific acoustic phonon modes in regions where the electronic wave functions are dominant. Additionally, by engineering interfaces within a quantum wire which are perpendicular to the quantum wire axis, it is possible to control the acoustic modes in wire-like regions of mesoscopic devices just as the classical acoustic modes are controlled in devices such as mufflers. Hence, the deformation and piezoelectric scattering rates may be partially tuned by tailoring the ambient phonon standing wave patterns in such mesoscopic structures.

BRIEF DESCRIPTION OF THE DRAWINGS

These and other objects of the invention will become readily apparent in light of the Detailed Description of he Invention and the attached drawings wherein.

DETAILED DESCRIPTION OF THE INVENTION

Through dramatic advances in nanofabrication technology, it is now feasible, if not routine, to produce nanoscale devices that manifest electrical properties that are determined principally by the laws of quantum physics rather than classical physics. From the point of view of possible applications of quantum based devices, it is essential that the electronic properties of such nanoscale devices be understood fully. In this respect, enlightening simulations of the capacitance of quantum dots, such as that found in Macucci et al, "Simulations Of Electronic Properties And Capacitance Of Quantum Dots," *Journal of Applied Physics*, Vol. 77, pages 3267–3276, reveal a rich atomic-like structure for the capacitance of two-dimensional circular quantum dots modelled on the basis of a self-consistent solution of the Schoedinger equation. In these studies many-body effects were included using a local density approximation as well as the optimized Kreiger-Li-Iafrate (KLI) exchange potential.

Figure 1:
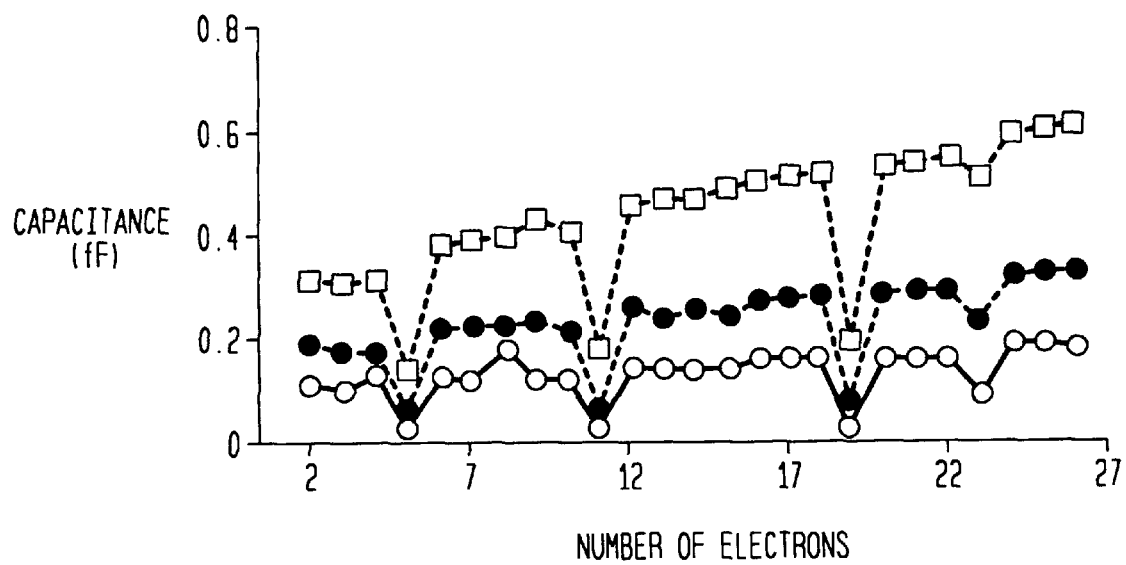
FIG. 1 is a graph of capacitance versus electron number for a two dimensional GaAs quantum dot.
Figure 2:
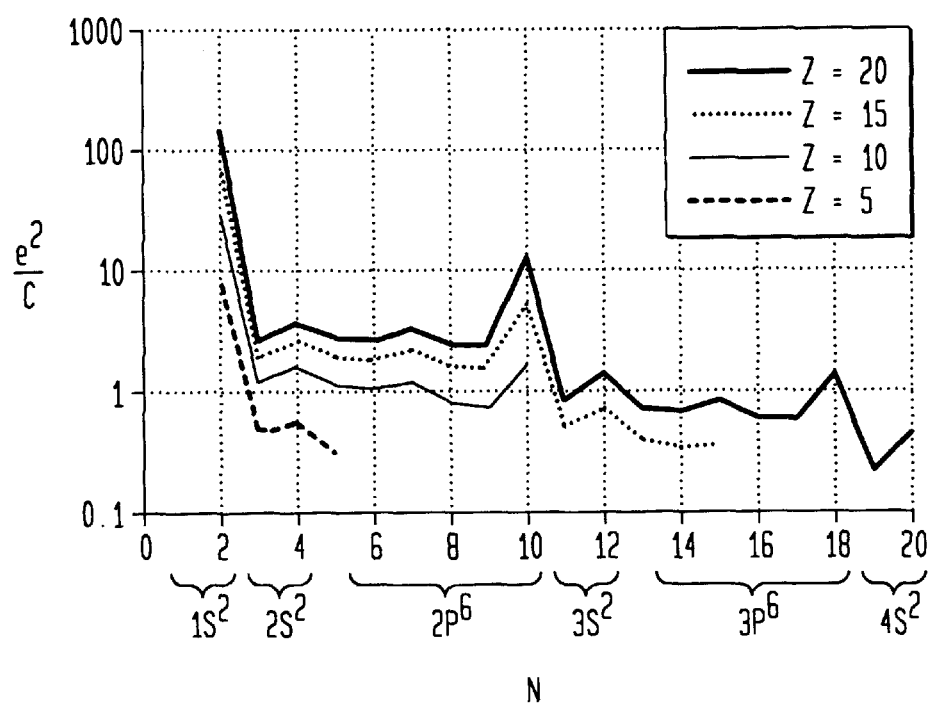
FIG. 2 is a graph of capacitive energy versus electron number for atoms with nuclear charge Z.

FIG. 1 depicts the capacitance versus electron number for a two-dimensional gallium arsenide quantum dot with a radius of 200 nm (empty squares), 100 nm (solid circles), and 50 nm (empty circles) in the presence of a conducting backgate located at a distance of ⅒ of the radius. At such short distances, it was demonstrated by Micucci et al that the presence of a backgate significantly increases the capacitance. As is evident from FIG. 1, the capacitance exhibits pronounced minima corresponding to shell filling just as in the case of an atom. These shell-like groupings were shown by Micucci et al to be due to the degeneracies introduced by symmetry and the dips are the consequence of the increased difference between the chemical potential values for consecutively accumulating electrons as each new set of degenerate orbitals starts to be filled. These shell-like groupings are illustrated clearly in FIG. 2, where the capacitive energy calculated with the KLI exchange potential is plotted as a function of the electron number of atoms with nuclear charge number Z. These non-classical effects in the quantum capacitance should be important in a variety of applications of quantum-effect devices including quantum dot memory cells for compact high-density data-storage devices.

Given that the electrical properties of nanoscale devices can be precisely engineered as stated above, it is also critical to the robustness and function of these devices that the longitudinal components of acoustic phonon modes in these quasi-one-dimensional structures be determined and manipulated. In fact, it is critical to determine the overlap of an acoustic phonon mode in the axial direction with a particular electronic wavefunction. Accordingly, the present invention will provide a means to manipulate this previously neglected axial mode structure of the acoustic phonons which determines the strengths of the deformation and piezoelectric scattering interactions in such quasi-one dimensional structures.

For realistic mesoscopic device designs, the quantum wire or quantum dot or quantum well input and output "leads" as well as the active regions of such devices with quantum geometries have finite lengths. Accordingly, deformation and piezoelectric scattering rates must be based on acoustic phonons that are quantized in all three spatial dimensions. As indicated in the Background of the Invention, the international community has heretofore not analyzed the role of three dimensional confinement of acoustic phonons in mesoscopic devices. However, it is clear from the solutions of classical acoustics that boundary conditions imposed at the ends of the wire-like regions can have profound effects on the properties of acoustic modes. By imposing appropriate conditions on such finite wire-like structures, it is possible according to the present invention to design any number of mesoscopic structures so that the electron-accoustic phonon scattering is reduced. This reduction is especially important for the case of mesoscopic devices which operate on the basis of "coherent" electron-wave interference effects.

The best manner to generally describe the method and devices according to the present invention in which wire-like confinement geometries are used is through the classical acoustic modes of devices such as organ pipes and or automobile mufflers. For example, the open boundary conditions at the ends of an organ pipe result in wave reflections with the reflected and transmitted waves having amplitudes with the same sign at the ends of the organ pipe. Constrained by these boundary conditions, the acoustic modes in an organ pipe evolve so that standing waves amplitudes are maximized and anti-nodes are formed at the ends of the pipe; that is, the dominant modes are those having wavelengths such that the length of a half integral number of wavelengths is equal to the length of the pipe. Hence, an organ pipe produces sounds at exit ports through the use of interfaces which produce modes with the required node and anti-node structure.

In the case of mesoscopic devices the situation is, in general, more complex than in the case of classical acoustic waveguides with open boundaries since in most cases the boundary conditions at the ends of the quantum wires require that both the mode displacements and the normal components of the stress be continuous. For the special case of a quantum wire which couples to an "end" region composed of the same material as that in the interior of the quantum wire, the open boundary condition is appropriate. Hence, in the case of a quantum wire with two "open" ends the ambient acoustic phonons in the wire will evolve so the dominant modes are those having wavelengths such that the length of a half integral number of wavelengths equals the length of the quantum wire. Just as in the organ pipe, these modes will have their maximum amplitudes at the ends of the wires; that is, anti-nodes are present at the ends of the quantum wires. Similar behavior is expected for the case of free-standing quantum well structures. For the case of a quantum wire which couples to (or terminates on) a region composed of a material with acoustic properties different from those of the material in the interior of the wire, the exact boundary condition must, in general, be applied. From classical acoustics, it is known that few analytical solutions are available for the cases where the complete boundary conditions must be used. A useful simplification arises in the case where the material in the interior of the quantum wire and the material at the end of the quantum wire have such different properties that the phonon modes are damped abruptly at the interface between the two materials. In this case, the so-called "clamped" boundary condition is adequate and the mode amplitudes may be assumed to vanish at such interfaces. Such a case applies at some metal-semiconductor interfaces. In particular, for a mesoscopic device having wire-like regions which terminate on a variety of metal regions (regions used as contacts, gates, barriers, etc.), it is satisfactory to apply clamped boundary conditions. At these boundaries, the acoustic modes will have nodes instead of the anti-nodes that are established in the case of an open boundary.

In one example of the general method of the present invention for determining the longitudinal components of acoustic phonon modes in wire-like nanostructures, the prescription formulated is assumed to be for a cylindrical quantum wire of finite length. The quantized acoustic phonon mode displacements for this structure are found in Stroscio et al, "Piezoelectric Scattering of Carriers in Confined Acoustic Modes in Cylindrical Quantum Wires," *Physical Review B*, Vol. 48, pgs. 1936–1939 (July 1993) for the case where the ends of cylindrical wire at z=0 and z=L, are treated as free boundaries. For this example, therefore, the displacement is:

$$u(r, z) = \sqrt{(h/4\pi M\omega) \times (2r/a) \times c\cos(m\pi z/L)}$$

where a is the wire radius, M is the mass of the ions in a unit cell, h is Planck's constant, $\omega$ is the phonon angular frequency, m is the mode number, and r and z are the radial and axial coordinates of the quantum wire, respectively. According to the present invention, the mode displacements for the case where the ends of the wire are clamped are given by replacing cos(m$\pi$z/L) with sin(m$\pi$z/L). This application of the present invention illustrates the general features of the axial components of the acoustic phonon modes in quantum wires subjected to free-standing or clamped boundary conditions at the ends of the wire.

With this set of simplified boundary conditions it would be evident to one skilled in the art to design mesoscopic structures with the phonons "engineered" to produce desired standing wave patterns. Indeed, by selecting various wire lengths it is possible to define a standing wave pattern that either maximizes or minimizes the amplitudes of specific acoustic phonon modes in regions where the electronic wave functions are dominant. Additionally, by engineering interfaces within a quantum wire which are perpendicular to the quantum wire axis, it is possible to control the acoustic modes in wire-like regions of mesoscopic devices just as the classical acoustic modes are controlled in devices such as mufflers. Hence, the deformation and piezoelectric scattering rates may be partially tuned by tailoring the ambient phonon standing wave patterns in such mesoscopic structures.

Figure 3:
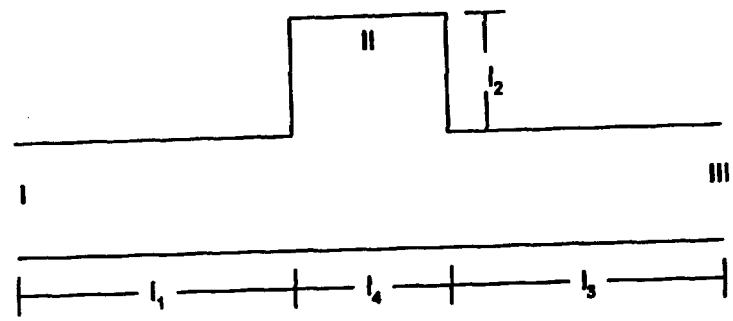
FIG. 3 is a cross-section view of a mesoscopic electronic device with an input port at open boundary I and an output port at open boundary III according to the present invention.
Figure 4:
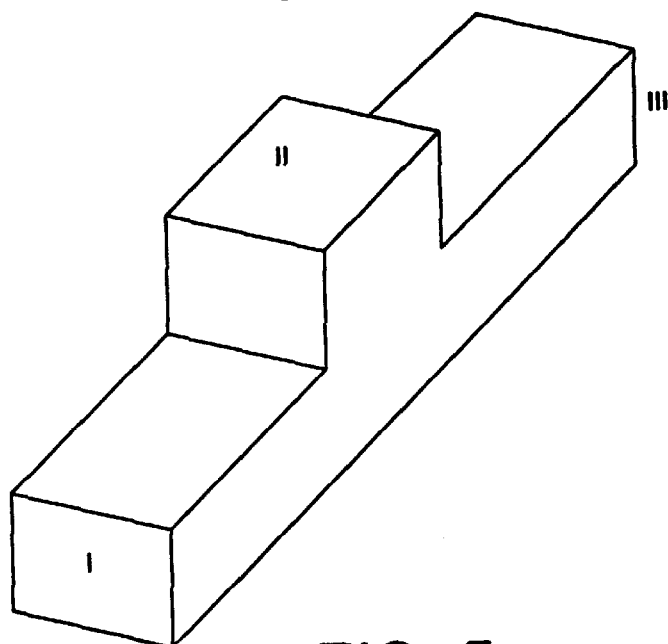
FIG. 4 is a perspective view of the device in FIG. 3.

The present invention necessarily includes modifications to mesoscopic electronic devices which encompass a class of de Broglie wave interference devices that contain wire-like regions where electron transport is primarily along the direction of the wire axis. A preferred embodiment of such a device is depicted in FIGS. 3 and 4. In FIG. 3 electrons are injected at port I which is the entrance to the mesoscopic electronic device according to the present invention. The mesoscopic electronic device at which electrons are injected at port I has a rectangular first quantum wire section having a length $l_1$. This mesoscopic structure also has an output port III which is the termination of a another section of rectangular quantum wire having a length $l_3$. In FIG. 3, the quantum wire of length $l_2$ and width $l_4$ serves as an acoustic phonon mode tuning stub which controls the de Broglie wave interference pattern in the mesoscopic device. The closed boundary at closed port II serves to reflect both the electron waves and acoustic phonon modes. In a preferred embodiment of the present invention, the closed boundary at closed port II is defined by a metal-semiconductor interface which forms a Schottky barrier by applying a potential to the Schottky barrier at interface (closed port) II. By applying such a potential, the electron-wave standing pattern at interface III can be modulated. The applied potential at interface II tunes the quantum-wire stub length $l_2$ and the electron-wave interference pattern is modulated accordingly. Of course, in the ideal mesoscopic electronic devices the electron wave will propagate without any attenuation and the optimum electron-wave interference pattern is produced at exit port III. In reality, however, electrons will always scatter with acoustic phonons and lose energy as a result of deformation potential or piezoelectric scattering. The central idea of this invention is that the boundaries of a mesoscopic electronic device may be used to tailor the acoustic phonon modes in the mesoscopic device in such a way that the electron-acoustic phonon scattering is reduced and accordingly, the electron waves propagate with a minimum of attenuation. At open boundaries, such as I and III, acoustic phonons will be transmitted and reflected in such a way that anti-nodes (maxima) of the acoustic phonons result. This phenomena occurs at the open ends of an organ pipe where anti-nodes occur and as a result of the open acoustic boundary conditions. At boundaries which are closed, such as at interface II, nodes occur as a result of the closed boundary acoustic conditions. The occurrence of open boundaries and a closed boundary acoustic conditions at interfaces I, II, and III will create standing acoustic wave patterns such that nodes (closed port II) and anti-nodes (open ports I and III) will result at the selected interfaces. Thus, half integral numbers of acoustic phonons modes will be established in the quantum wire input and output leads of the mesoscopic electronic device.

Figure 5:
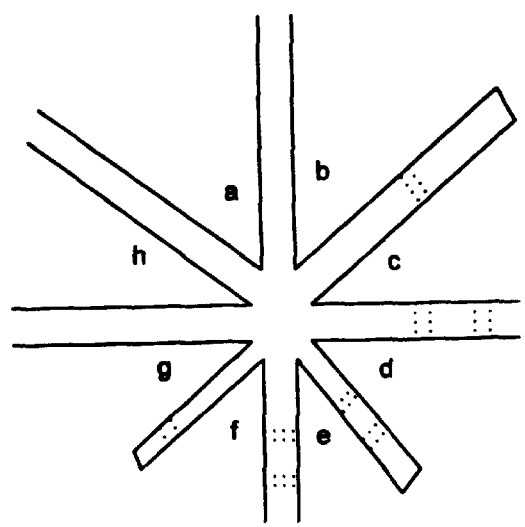
FIG. 5 is a cross-section view of a mesoscopic electronic device with N quantum wire channels with varying interior boundaries according to the present invention.

FIG. 5 depicts a mesoscopic device with N quantum wires input and output channels. Several of these channels contain structures which create internal boundaries along the selected quantum wire axes. These internal boundaries represent regions with large or small mismatches in acoustic impedances or superlattices as well as "muffler-like" structures. By controlling the acoustic properties of the these internal boundaries, the acoustic phonon modes of the device may be tailored to obtain an optimum dampening of the potential deformation and the piezoelectric scattering rates of a propagating electron wave caused by the scattering of acoustic phonons modes.

As shown in FIG. 5, any number of quantum wires can be used which have any number of interior boundaries. These interior boundaries are represented by double dashed lines and can be created by any means known in the art such as particular doping or superlattice structure. Of course, as those skilled in the art will readily realize each of the quantum wires whether they be used as an input, output, or a form of tuning stub as depicted in FIGS. 3 and 4, will be disposed at various angles which are denoted as a–h. Obviously, depending on these angles and the length of the quantum wires and tuning stubs the acoustic phonon modes may be realized in a node or anti-node, depending on the device structure and the closed and/or open boundary configurations.

Therefore, although the present invention has been described with respect to its application to two generic embodiments, those skilled in the art would be able to apply the present invention to any number of other high-speed polarization scramblers. Accordingly, the breadth of the present invention should not be limited to the embodiments described above but only by the appended claims.

What is claimed is:

1. A method of propagating an electron wave through a mesoscopic electronic device structure comprising the steps of:

forming an input quantum structure having an input port, the input quantum structure having a first open acoustic phonon mode boundary condition;

forming an output quantum structure having an output port, the output quantum structure having a second open acoustic phonon mode boundary condition, and the output quantum structure being connected to the input quantum structure such that an electron wave propagates from the input port to the output port; and establishing an acoustic phonon node disposed along a path of propagation of the electron wave.

2. The method of claim 1 wherein the step establishing an acoustic phonon node is further defined as forming a tuning stub such that a closed phonon acoustic boundary is established by a metal to semiconductor interface.

3. The method of claim 2 wherein desired dominant modes of the acoustic phonons in the mesoscopic structure are established such that a length of a half-integral number of wavelengths equals a length of the mesoscopic structure through which the desired electron wave is propagating; and wherein the metal to semiconductor interface is formed such that the metal and the semiconductor materials have such different properties so as to dampen the acoustic phonon modes at the metal to semiconductor interface.

4. The method of claim 3 wherein the metal to semiconductor interface establishes anti-nodes at the input and output ports.

5. The method of claim 1 further comprising the steps of forming a plurality of input and output ports each of which is connected to a section of quantum wire and each of which is separated by a predetermined angle; and establishing phonon acoustic interior boundaries at a select number of the input and output ports so as to create phonon acoustic nodes.

6. The method of claim 5 wherein the interior acoustic boundaries establish anti-nodes at select inputs and outputs of the mesoscopic structure.

7. The method of claim 2 wherein the input and output quantum structures are cylindrical quantum wires, wherein the ends of cylindrical wire are assumed to be at z=0 and z=L, and wherein a phonon acoustic displacement is calculated as:

$$u(r, z) = \sqrt{(h/4\pi M\omega) \times (2r/a) \times \sin(m\pi z/L)}$$

where a is the wire radius, M is the mass of the ions in a unit cell, h is Planck's constant, $\omega$ is the phonon angular frequency, m is the mode number, and r and z are the radial and axial coordinates of the quantum wire, respectively.

8. In a mesoscopic quantum wire structure for propagating an electron wave between an input port at which a first open acoustic phonon mode boundary is presented and an output port at which a second open acoustic phonon mode boundary is presented, the improvement comprising:

an acoustic phonon node is disposed at a closed boundary between the input port and the output port to render the length of the quantum wire structure equal to a half integral number of the acoustic phonon mode wavelengths.

9. The quantum wire structure of claim 8 wherein the acoustic phonon node is a tuning stub formed such that the closed boundary is derived at a metal to semiconductor interface.

10. The quantum wire structure of claim 9 wherein the metal and semiconductor materials of the interface have such different properties that the acoustic phonon modes are dampened at the interface.

11. The quantum wire structure of claim 10 wherein the interface establishes anti-nodes at the input and output ports.

12. The quantum wire structure of claim 8 wherein a plurality of input and output ports are disposed in pairs on quantum wires which are separated at predetermined angles.

13. The quantum wire structure of claim 12 wherein antinodes are established within particular quantum wires, between the input and output ports thereof.

* * * * *